(12) United States Patent
Chen et al.

(10) Patent No.: US 9,023,708 B2
(45) Date of Patent: May 5, 2015

(54) METHOD OF FORMING SEMICONDUCTOR DEVICE

(71) Applicant: United Microelectronics Corp., Hsinchu (TW)

(72) Inventors: Li-Chiang Chen, Tainan (TW); Jiunn-Hsiung Liao, Tainan (TW); Hsuan-Hsu Chen, Tainan (TW); Feng-Yi Chang, Tainan (TW); Chieh-Te Chen, Kaohsiung (TW); Shang-Yuan Tsai, Kaohsiung (TW); Ching-Pin Hsu, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/866,456

(22) Filed: Apr. 19, 2013

(65) Prior Publication Data

US 2014/0315365 A1 Oct. 23, 2014

(51) Int. Cl.
  *H01L 21/336* (2006.01)
  *H01L 29/423* (2006.01)
  *H01L 29/66* (2006.01)

(52) U.S. Cl.
  CPC .... *H01L 29/42372* (2013.01); *H01L 29/66545* (2013.01)

(58) Field of Classification Search
  CPC ................... H01L 29/66545; H01L 29/66871
  See application file for complete search history.

(56) References Cited

U.S. PATENT DOCUMENTS

| | | |
|---|---|---|
| 5,892,282 A | 4/1999 | Hong et al. |
| 6,096,659 A | 8/2000 | Gardner et al. |
| 6,177,303 B1 | 1/2001 | Schmitz et al. |
| 6,303,418 B1 | 10/2001 | Cha et al. |
| 6,458,684 B1 | 10/2002 | Guo et al. |
| 6,573,134 B2 | 6/2003 | Ma et al. |
| 6,960,416 B2 | 11/2005 | Mui et al. |
| 7,126,199 B2 | 10/2006 | Doczy et al. |
| 7,144,783 B2 | 12/2006 | Datta et al. |
| 7,148,548 B2 | 12/2006 | Doczy et al. |
| 7,153,784 B2 | 12/2006 | Brask et al. |
| 7,176,090 B2 | 2/2007 | Brask et al. |
| 7,186,605 B2 | 3/2007 | Cheng et al. |
| 7,208,361 B2 | 4/2007 | Shah et al. |
| 7,217,611 B2 | 5/2007 | Kavalieros et al. |
| 7,355,281 B2 | 4/2008 | Brask et al. |
| 7,407,876 B2 | 8/2008 | Ishizaka |
| 7,556,998 B2 | 7/2009 | Park et al. |

(Continued)

OTHER PUBLICATIONS

Rappich et al., 'In situ fourier transform infrared investigation on the electrolytic hydrogenation of n-silicon (111),' 1995 J. Electrochem. Soc., vol. 142, No. 4, pp. 1233-1237.*

*Primary Examiner* — Fernando L Toledo
*Assistant Examiner* — Bryan Junge
(74) *Attorney, Agent, or Firm* — J. C. Patents

(57) ABSTRACT

A method of forming a semiconductor device is provided. At least one gate structure including a dummy gate is formed on a substrate. A contact etch stop layer and a dielectric layer are formed to cover the gate structure. A portion of the contact etch stop layer and a portion of the dielectric layer are removed to expose the top of the gate structure. A dry etching process is performed to remove a portion of the dummy gate of the gate structure. A hydrogenation treatment is performed to the surface of the remaining dummy gate. A wet etching process is performed to remove the remaining dummy gate and thereby form a gate trench.

18 Claims, 4 Drawing Sheets

(56) References Cited

U.S. PATENT DOCUMENTS

| | | |
|---|---|---|
| 7,700,479 B2 | 4/2010 | Huang et al. |
| 2001/0016398 A1* | 8/2001 | Kudelka et al. ............... 438/427 |
| 2006/0024953 A1 | 2/2006 | Papa Rao et al. |
| 2007/0145591 A1 | 6/2007 | Yano et al. |
| 2007/0259519 A1 | 11/2007 | Yang et al. |
| 2007/0262451 A1 | 11/2007 | Rachmady et al. |
| 2007/0272123 A1 | 11/2007 | Kennedy et al. |
| 2008/0076216 A1 | 3/2008 | Pae et al. |
| 2008/0224235 A1 | 9/2008 | Lavoie et al. |
| 2009/0057769 A1 | 3/2009 | Wei et al. |
| 2009/0186458 A1 | 7/2009 | Yu et al. |
| 2010/0044783 A1 | 2/2010 | Chuang et al. |
| 2010/0044799 A1* | 2/2010 | Kurahashi et al. ............ 257/369 |
| 2010/0065926 A1 | 3/2010 | Yeh et al. |
| 2010/0068877 A1 | 3/2010 | Yeh et al. |
| 2010/0087055 A1 | 4/2010 | Lai et al. |
| 2010/0124818 A1 | 5/2010 | Lee et al. |
| 2010/0193860 A1* | 8/2010 | Scheiper et al. .............. 257/327 |
| 2010/0244141 A1 | 9/2010 | Beyer et al. |
| 2011/0151655 A1* | 6/2011 | Chan et al. .................... 438/589 |

* cited by examiner

METHOD OF FORMING SEMICONDUCTOR DEVICE

BACKGROUND OF THE INVENTION

1. Field of Invention

The present invention relates to a method of forming a semiconductor device, and more generally to a method of forming a semiconductor device having a metal gate.

2. Description of Related Art

As the dimension of a semiconductor device is getting smaller, the dimension of the gate structure and therefore the thickness of the gate dielectric layer are reduced accordingly. The gate dielectric layer usually includes silicon oxide. A leakage current occurs when the $SiO_2$ gate dielectric layer becomes thinner. To reduce the leakage current, one known method is to use a high dielectric constant (high-k) material instead of silicon oxide for forming the gate dielectric layer. However, under the condition of using a high-k material as a gate dielectric layer, the polysilicon gate may react with the high-k material to generate the so-called Fermi-level pinning, such that the threshold voltage is increased and the performance of the device is affected.

To avoid an increase in the threshold voltage caused by the reaction between the polysilicon gate and the high-k material, one known method is to use a metal layer as a gate. The conventional method for forming a metal gate is to deposit a silicon oxide layer to cover a dummy gate after the dummy gate is formed on a substrate. Thereafter, a portion of the silicon oxide layer is removed with a chemical polishing chemical (CMP) process to expose the dummy gate. Afterwards, the dummy gate is removed to form a gate trench in the silicon oxide layer. A metal gate is then formed in the gate trench. However, dummy gate residues are often observed after the dummy gate is removed. Such dummy gate residues are undesirable and may deteriorate the performance of the metal-gate device.

SUMMARY OF THE INVENTION

Accordingly, the present invention provides a method of forming a semiconductor structure, in which the dummy gate can be completely removed so as to improve the performance of the subsequently formed metal gate.

The present invention provides a method of forming a semiconductor device. At least one gate structure including a dummy gate is formed on a substrate. A contact etch stop layer and a dielectric layer are formed to cover the gate structure. A portion of the contact etch stop layer and a portion of the dielectric layer are removed to expose a top of the gate structure. A dry etching process is performed to remove a portion of the dummy gate of the gate structure. A hydrogenation treatment is performed to a surface of the remaining dummy gate. A wet etching process is performed to remove the remaining dummy gate and thereby form a gate trench.

According to an embodiment of the present invention, a gas used in the hydrogenation treatment includes $H_2$, $H_2N_2$, He or a combination thereof.

According to an embodiment of the present invention, a gas used in the dry etching process includes $Cl_2$, HBr, $NH_3$ or a combination thereof.

According to an embodiment of the present invention, an etchant used in the wet etching process includes tetramethyl ammonium hydroxide (TMAH).

According to an embodiment of the present invention, the dummy gate includes pure amorphous silicon or a combination of amorphous silicon and crystalline silicon.

According to an embodiment of the present invention, a method of forming the dummy gate includes forming an amorphous silicon layer, and performing an annealing process to the amorphous silicon layer so as to partially transform the amorphous silicon layer into a polysilicon layer.

According to an embodiment of the present invention, the gate structure includes an interfacial layer and the dummy gate.

According to an embodiment of the present invention, the interfacial layer includes silicon oxide, silicon oxynitride, a high-k material with a dielectric constant greater than 4, or a combination thereof.

According to an embodiment of the present invention, the gate structure further includes a spacer disposed on the substrate on a sidewall of the dummy gate, and two source/drain regions disposed in the substrate beside the dummy gate. Besides, the two source/drain regions include doped regions, SiGe, SiC, SiP or a combination thereof.

According to an embodiment of the present invention, the hydrogenation treatment reduces an amount of a crystallographic plane {111} in the dummy gate.

The present invention further provides a method of forming a semiconductor device. At least one gate structure including a dummy gate is formed on a substrate. A contact etch stop layer and a dielectric layer are formed to cover the gate structure. A portion of the contact etch stop layer and a portion of the dielectric layer are removed to expose a top of the gate structure. A dry etching process is performed to remove a portion of the dummy gate of the gate structure. A protection layer is formed on a surface of the remaining dummy gate. A wet etching process is performed to remove the protection layer and the remaining dummy gate and thereby form a gate trench.

According to an embodiment of the present invention, the protection layer includes Si—H bonds.

According to an embodiment of the present invention, a gas used in the dry etching process includes $Cl_2$, HBr, $NH_3$ or a combination thereof.

According to an embodiment of the present invention, an etchant used in the wet etching process includes tetramethyl ammonium hydroxide (TMAH).

According to an embodiment of the present invention, the dummy gate includes pure amorphous silicon or a combination of amorphous silicon and crystalline silicon.

According to an embodiment of the present invention, a method of forming the dummy gate includes forming an amorphous silicon layer, and performing an annealing process to the amorphous silicon layer so as to partially transform the amorphous silicon layer into a polysilicon layer.

According to an embodiment of the present invention, the gate structure includes an interfacial layer and the dummy gate.

According to an embodiment of the present invention, the interfacial layer includes silicon oxide, silicon oxynitride, a high-k material with a dielectric constant greater than 4, or a combination thereof.

According to an embodiment of the present invention, the gate structure further includes a spacer disposed on the substrate on a sidewall of the dummy gate, and two source/drain regions disposed in the substrate beside the dummy gate. Besides, the two source/drain regions include doped regions, SiGe, SiC, SiP or a combination thereof.

According to an embodiment of the present invention, an amount of a crystallographic plane {111} of the protection layer is lower than an amount of a crystallographic plane {111} of the dummy gate.

In view of the above, in the present invention, the dummy gate can be completely removed as long as a hydrogenation treatment is performed prior to the final wet etching process. With such method, the conventional dummy gate residues are not observed and thus the performance of the metal gate device can be further improved. Besides, it is easy and simple to integrate the method of the invention into the existing CMOS process, thereby achieving competitive advantages over competitors.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
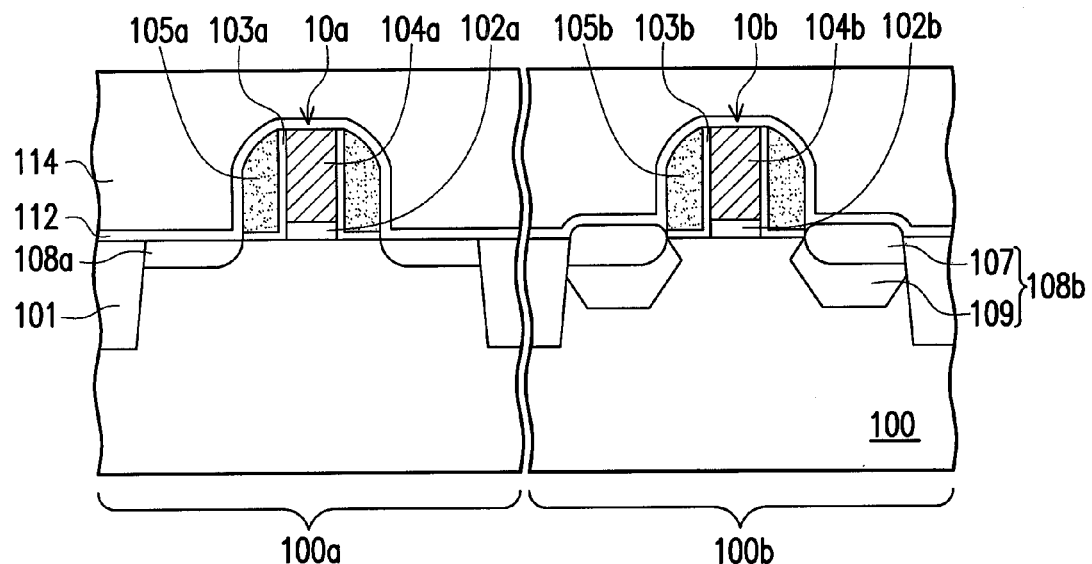
FIGS. 1A to 1F are schematic cross-sectional views illustrating a method of forming a semiconductor structure according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1F are schematic cross-sectional views illustrating a method of forming a semiconductor structure according to an embodiment of the present invention.

Referring to FIG. 1A, at least one gate structure is formed on a substrate 100. The substrate 100 can be a semiconductor substrate, such as a silicon substrate. In this embodiment, the substrate 100 has a first area 100a and a second area 100b, and gate structures 10a and 10b are respectively formed in the first and second areas 100a and 100b, but the present invention is not limited thereto. At least one shallow trench isolation (STI) structure 101 is formed in the substrate 100 between the gate structures 10a and 10b for providing electrical isolation. The first and second areas 100a and 100b are for forming semiconductor devices with different conductivity types. In an embodiment, the first area 100a is for forming an N-type device, and the second area 100b is for forming a P-type device.

The gate structure 10a includes an interfacial layer 102a and a dummy gate 104a sequentially formed on the substrate 100. Similarly, the gate structure 10b includes an interfacial layer 102b and a dummy gate 104b sequentially formed on the substrate 100. Each of the interfacial layers 102a and 102b includes silicon oxide, silicon oxynitride, a high-k material with a dielectric constant greater than 4, or a combination thereof. The high-k material can be metal oxide, such as rare earth metal oxide. The high-k material can be selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST), wherein x is between 0 and 1. Each of the dummy gates 104a and 104b includes pure amorphous silicon or a combination of amorphous silicon and crystalline silicon. The dummy gates 104a and 104b can be doped.

In an embodiment, for a metal gate (high-k first) process, each of the gate structures 10a and 10b may include a composite layer (containing a lower silicon oxide layer and an upper high-k layer) as an interfacial layer 102a/102b and a silicon-containing layer as a dummy gate 104a/104b. In addition, a barrier layer (not shown) is further disposed between the high-k layer and the dummy gate. The barrier layer includes TiN.

In another embodiment, for a metal gate (high-k last) process, each of the gate structures 10a and 10b may include a silicon oxide layer as an interfacial layer 102a/102b and a silicon-containing layer as a dummy gate 104a/104b.

The method of forming the interfacial layer 102a/102b and the dummy gate 104a/104b includes sequentially forming an interfacial material layer and a gate material layer (not shown) on the substrate 100. In an embodiment, the gate material layer can be a pure amorphous silicon layer, and the interfacial material layer and the pure amorphous silicon layer are patterned to form the interfacial layer 102a/102b and the dummy gate 104a/104b. In another embodiment, the gate material layer can be an amorphous silicon layer, and an annealing process is then performed to the amorphous silicon layer so as to partially transform the amorphous silicon layer into a crystalline silicon layer (or called a polysilicon layer). Thereafter, the interfacial material layer and the mixed layer including amorphous silicon and polysilicon are patterned to form the interfacial layer 102a/102b and the dummy gate 104a/104b.

Continue referring to FIG. 1A, the gate structure 10a further includes a liner 103a and a spacer 105a formed on the sidewall of the dummy gate 104a. Similarly, the gate structure 10b further includes a liner 103b and a spacer 105b formed on the sidewall of the dummy gate 104b. Each of the liners 103a and 103b includes silicon oxide or a suitable insulating material, and each of the spacers 105a and 105b includes silicon nitride or a suitable insulating material. The method of forming the liner 103a/103b and the spacer 105a/105b includes sequentially depositing a liner material layer and a spacer material layer on the substrate 100, and then performing an anisotropic etching process to the liner material layer and the spacer material layer.

The gate structure 10a further includes two source/drain regions 108a formed in the substrate 100 beside the dummy gate 104a. Similarly, the gate structure 10b further includes two source/drain regions 108b formed in the substrate 100 beside the dummy gate 104b. In this embodiment, the source/drain regions 108a in the first area 100a can be N-type doped regions, and the source/drain regions 108b in the second area 100b can be combination of P-type doped regions 107 and SiGe layers 109, but the present invention is not limited thereto. In another embodiment, the source/drain regions 108a in the first area 100a can be combination of N-type doped regions and SiC or SiP layers, and the source/drain regions 108b in the second area 100b can be P-type doped regions. In an embodiment, the method of forming the source/drain regions 108a/108b includes the following steps. N-type doped regions are formed in the first area 100a through an ion implantation process. Thereafter, a mask layer (not shown) is formed to cover the first area 100a. Afterwards, recesses (not shown) are formed in the second area 100b beside the dummy gate 104b. SiGe layers 109 are formed in the recesses and P-type doped regions 107 are then formed in the SiGe layers 109 through an ion implantation process.

Still referring to FIG. 1A, a contact etch stop layer (CESL) 112 and a dielectric layer 114 are sequentially formed to cover the gate structures 10a and 10b. The method of forming each of the CESL 112 and the dielectric layer 114 includes performing a chemical vapor deposition (CVD) process, an atomic layer deposition (ALD) process or a suitable deposition process. The CESL 112 includes silicon nitride or a suitable insulating material and the dielectric layer 114 includes silicon oxide, a low-k material, a suitable insulating material or a combination thereof.

Figure 1B:
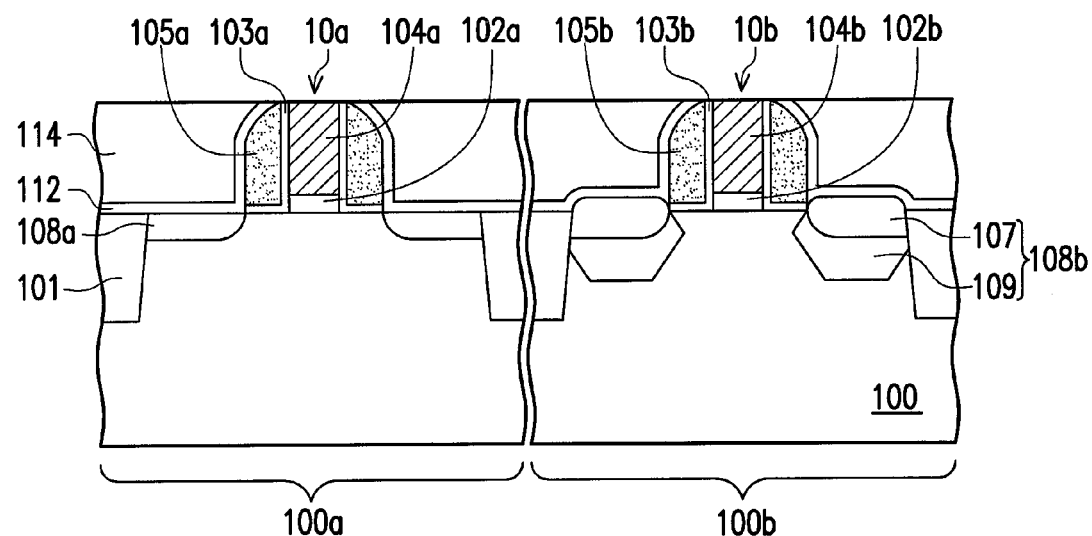

Referring to FIG. 1B, a portion of the CESL 112 and a portion of the dielectric layer 114 are removed to expose the tops of the gate structures 10a and 10b. The removing step includes a chemical mechanical polishing (CMP) process.

Figure 1C:
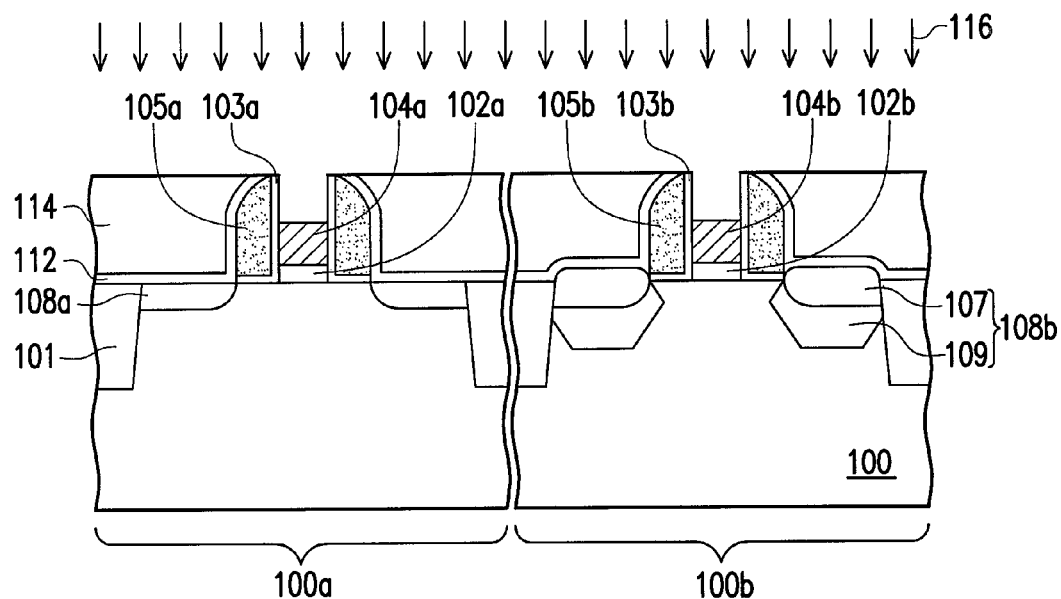

Referring to FIG. 1C, a dry etching process 116 is performed to remove a portion of dummy gates 104a and 104b of the gate structures 10a and 10b. In this embodiment, about $1/2\sim2/3$ (e.g. $1/2$) the amount of the original dummy gate 104a/104b is removed. The gas used in the dry etching process 116 includes $Cl_2$, HBr, $NH_3$ or a combination thereof. In an embodiment, the gate structure 10a/10b can further include a cap layer (not shown) such as silicon nitride or other suitable insulating material formed on the dummy gate 104a/104b, and in such case, the cap layer can be simultaneously removed during the dry etching process 116.

Figure 1D:
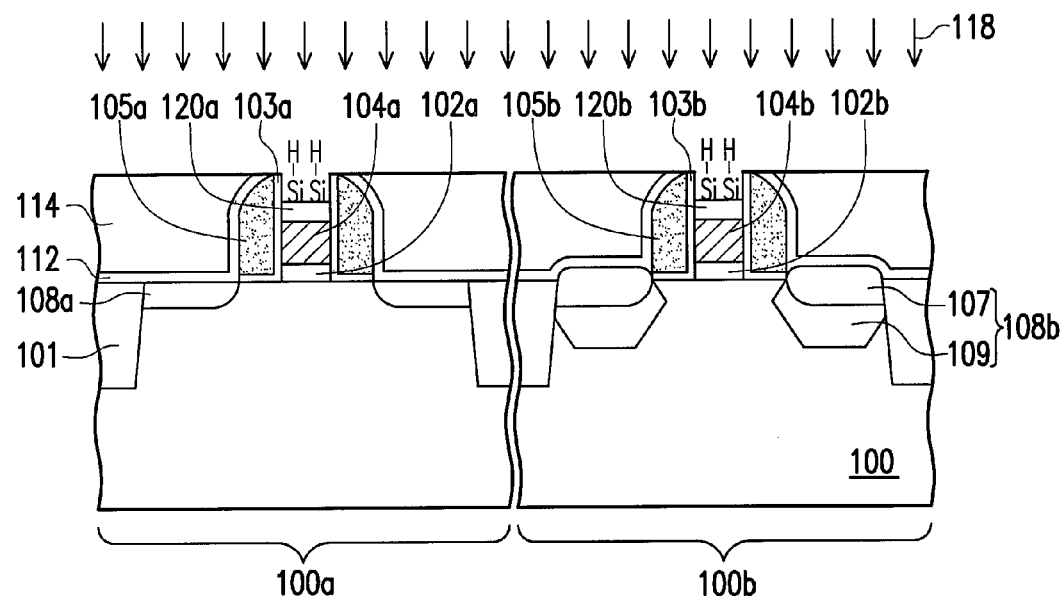

Referring to FIG. 1D, a hydrogenation treatment 118 is performed to the surface of the remaining dummy gates 104a and 104b, so as to form protection layers 120a and 120b respectively on surfaces of the remaining dummy gates 104a and 104b.

Specifically, since the dummy gates 104a and 104b include amorphous silicon, dangling bonds each of which is an unsatisfied valence on an immobilised silicon atom are present respectively in their disordered amorphous structures. During the hydrogenation treatment 118, a portion of silicon atoms of the dangling bonds in the dummy gates 104a and 104b are passivated to form the protection layers 120a and 120b. More specifically, the protection layers 120a and 120b are formed from the surface portions of the dummy gates 104a and 104b through the hydrogenation treatment 118. Accordingly, each of the protection layers 120a and 120b includes Si—H bonds. The gas used in the hydrogenation treatment 118 includes $H_2$, $H_2N_2$, helium or a combination thereof. For example, in the hydrogenation treatment 118, $H_2$ and/or $H_2N_2$ can serve as a hydrogenation gas, and helium can serve as a carrier gas.

Figure 1E:
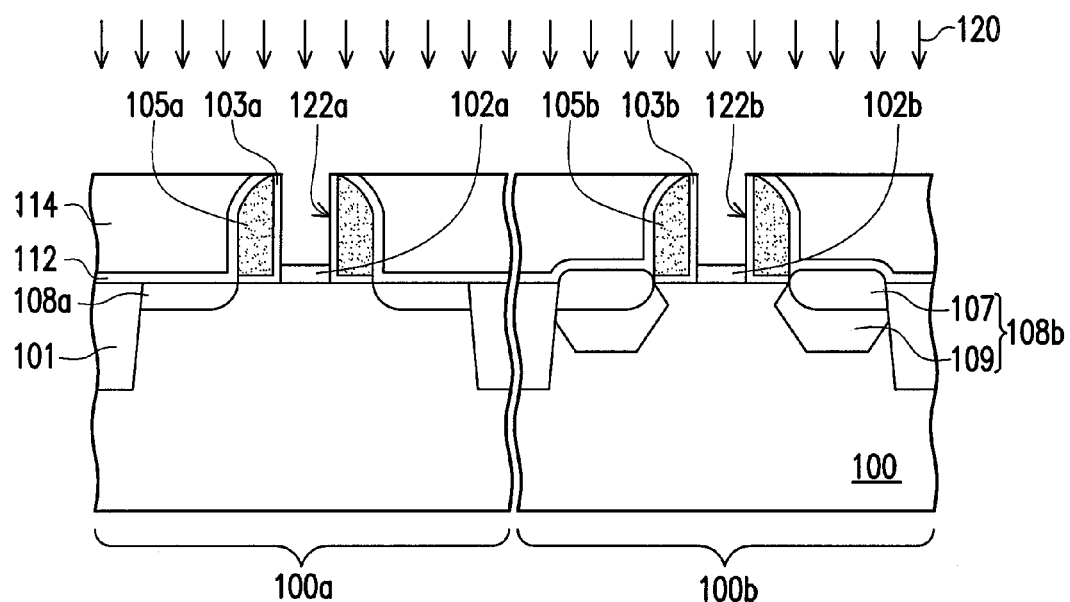

Referring to FIG. 1E, a wet etching process 120 is performed to remove the protection layers 120a and 120b and the remaining dummy gates 104a and 104b, so as to form gate trenches 122a and 122b respectively in the first and second areas 100a and 100b. The etchant used in the wet etching process 120 includes tetramethyl ammonium hydroxide (TMAH). In an embodiment, the etchant is REZI-38 available from Avantor Performance Materials.

It is noted that the Si—H bonds on surfaces of the dummy gates 104a and 104b help to improve the etching rate of the wet etching process 120 for the dummy gates 104a and 104b. Specifically, the dangling bonds of the dummy gates 104a and 104b are easily boned to oxygen atoms to form Si—O bonds. Such Si—O bonds would suppress the etching rate of the subsequently wet etching process 120 for the dummy gates 104a and 104b and therefore cause the incomplete removing of the dummy gates 104a and 104b. However, in the present invention, Si—H bonds rather than Si—O bonds are formed on the surfaces of the dummy gates 104a and 104b, so that the etching rate of the wet etching process 120 for the dummy gates 104a and 104b can be significantly improved, and the conventional dummy gate residues are not observed.

Another mechanism is also possible. For example, it is known that the wet etching process is orientation dependent, and the TMAH etching rate for crystallographic plane {111} is much lower than that of another crystallographic plane such as {100}, {110}, {210}, {211}, {220}, {221}, {310}, {311}, {320}, {331}, {530}, {540} or the like. That is, as the amount of crystallographic plane {111} in the dummy gate and/or the protection layer is reduced, the TMAH etching rate for the dummy gate becomes higher.

Figure 2:
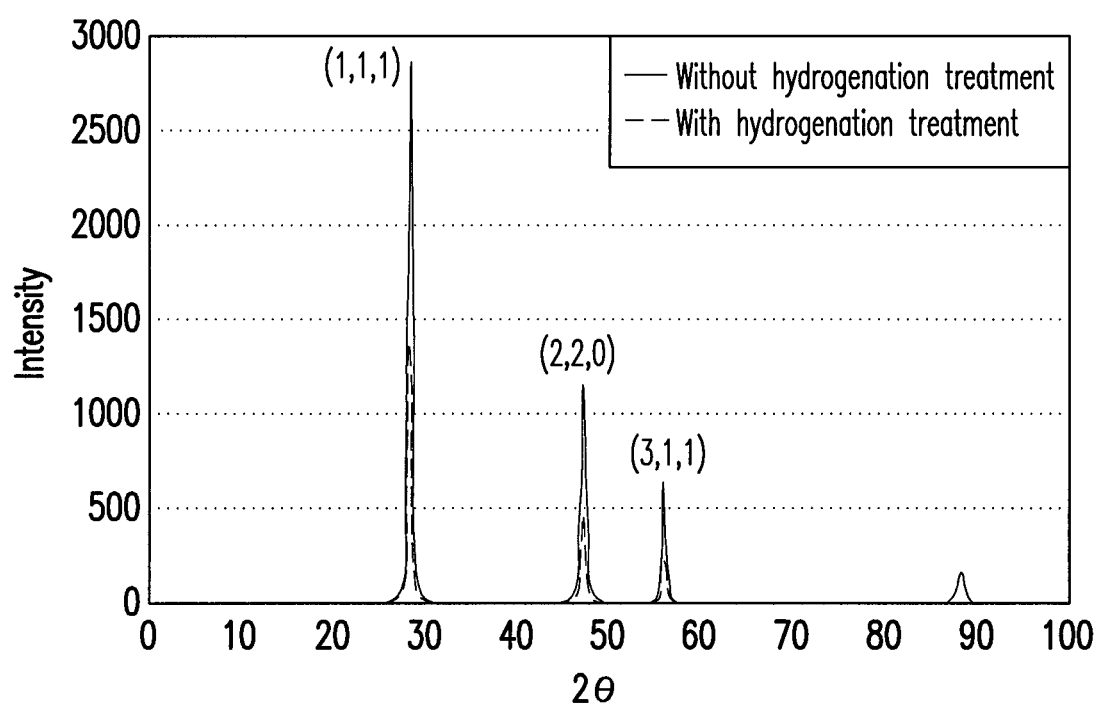
FIG. 2 illustrates an X-ray diffraction (XRD) spectrum of a dummy gate with/without a hydrogenation treatment performed thereon.

FIG. 2 illustrates an X-ray diffraction (XRD) spectrum of a dummy gate with/without a hydrogenation treatment performed thereon. As shown in FIG. 2, it is obvious that that the dummy gate with a hydrogenation treatment performed thereon has a lower amount of crystallographic plane {111} than that of the dummy gate without a hydrogenation treatment performed thereon. In other words, the hydrogenation treatment helps to reduce the amount of crystallographic plane {111} in each dummy gate, thereby improving the etching rate of the wet etching process 120 for each dummy gate.

In this embodiment, the protection layer on the corresponding dummy gate is formed from the surface portion of the dummy gate after the hydrogenation treatment. Therefore, FIG. 2 can be understood in a way that the amount of crystallographic plane {111} of the protection layer (i.e. experimental example with a hydrogenation treatment) is lower than that of the dummy gate (i.e. comparative example without a hydrogenation treatment). In an embodiment, the etching rate of the wet etching process 120 of the invention can be increased by about 50%, as compared to the conventional wet etching process.

Figure 1F:
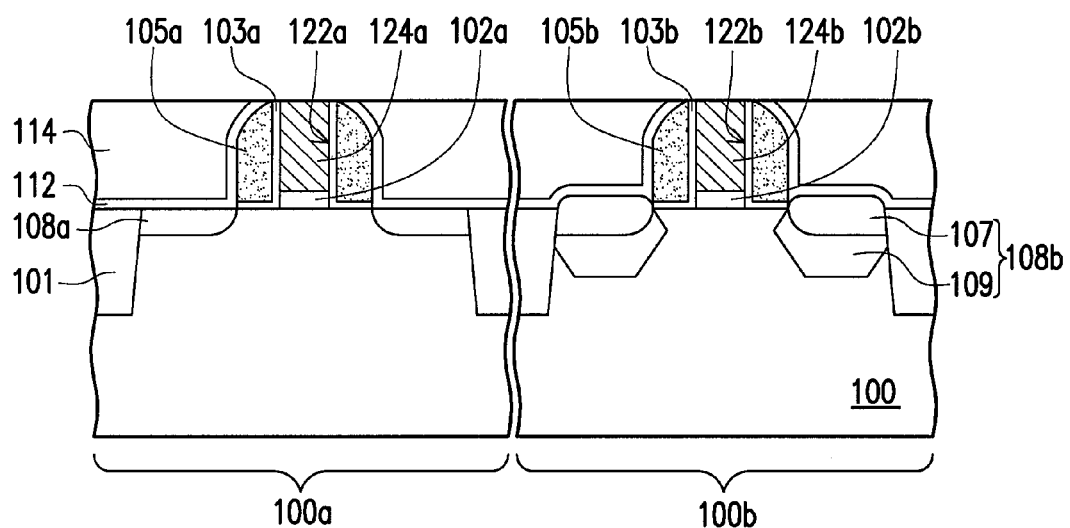

Referring to FIG. 1F, metal gates 124a and 124b are formed respectively in the gate trenches 122a and 122b. Each of the metal gates 124a and 124b includes a work function metal layer and a low-resistivity metal layer (not shown). The work function metal layer includes TiAl for an N-type device or TiN for a P-type device. The low-resistivity metal layer includes Al or Cu.

In an embodiment, for a metal gate (high-k first) process, the following process step after completely removing the dummy gates 104a and 104b includes filling the gate trenches 122a and 122b respectively with the metal gates 124a and 124b, as shown in FIG. 1F.

In another embodiment, for a metal gate (high-k last) process, the following process steps after completely removing the dummy gates 104a and 104b include removing the interfacial layers 102a and 102b, forming a gate dielectric layer (e.g. silicon oxide), a high-k layer (e.g. $HfO_2$) and a barrier layer (e.g. TiN) on the surface of each of the gate trenches 122a and 122b, and filling the gate trenches 122a and 122b respectively with the metal gates 124a and 124b. These steps are well-known to persons having ordinary skill in the art and are not iterated herein.

In summary, in the present invention, the dummy gate can be completely removed as long as a hydrogenation treatment is performed prior to the final wet etching process. The hydrogenation treatment reduces the amount of crystallographic plane {111} in each dummy gate and prevents Si—O bonds from occurring, so that the etching rate of the wet etching process for each dummy gate can be significantly increased. With such method, the conventional dummy gate residues are not observed and thus the performance of the metal gate device can be further improved. Besides, it is easy and simple to integrate the method of the invention into the existing CMOS process, thereby achieving competitive advantages over competitors.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of forming a semiconductor device, comprising:
   forming at least one gate structure on a substrate, wherein the gate structure comprises a dummy gate;
   forming a contact etch stop layer and a dielectric layer to cover the gate structure;
   removing a portion of the contact etch stop layer and a portion of the dielectric layer to expose a top of the gate structure;
   performing a dry etching process to remove a portion of the dummy gate of the gate structure;
   performing a hydrogenation treatment to a surface of the remaining dummy gate, wherein a gas is used in the hydrogenation treatment and the hydrogenation treatment reduces an amount of a crystallographic plane {111} in the dummy gate; and
   performing a wet etching process to remove the remaining dummy gate and thereby form a gate trench.

2. The method of claim 1, wherein a gas used in the hydrogenation treatment comprises $H_2$, $H_2N_2$, He or a combination thereof.

3. The method of claim 1, wherein a gas used in the dry etching process comprises $Cl_2$, HBr, $NH_3$ or a combination thereof.

4. The method of claim 1, wherein an ethant used in the wet etching process comprises tetramethyl ammonium hydroxide (TMAH).

5. The method of claim 1, wherein the dummy gate comprises pure amorphous silicon or a combination of amorphous silicon and crystalline silicon.

6. The method of claim 1, wherein a method of forming the dummy gate comprises:
   forming an amorphous silicon layer; and
   performing an annealing process to the amorphous silicon layer so as to partially transform the amorphous silicon layer into a polysilicon layer.

7. The method of claim 1, wherein the gate structure comprises an interfacial layer and the dummy gate.

8. The method of claim 7, wherein the interfacial layer comprises silicon oxide, silicon oxynitride, a high-k material with a dielectric constant greater than 4, or a combination thereof.

9. The method of claim 7, wherein the gate structure further comprises:
   a spacer, disposed on the substrate on a sidewall of the dummy gate; and
   two source/drain regions, disposed in the substrate beside the dummy gate, and
   wherein the two source/drain regions comprise doped regions, SiGe, SiC, SiP or a combination thereof.

10. A method of forming a semiconductor device, comprising:
    forming at least one gate structure on a substrate, wherein the gate structure comprises a dummy gate;
    forming a contact etch stop layer and a dielectric layer to cover the gate structure;
    removing a portion of the contact etch stop layer and a portion of the dielectric layer to expose a top of the gate structure;
    performing a dry etching process to remove a portion of the dummy gate of the gate structure;
    performing a hydrogenation treatment to a surface of the remaining dummy gate, so as to form a protection layer on a surface of the remaining dummy gate, wherein a gas is used in the hydrogenation treatment and an amount of a crystallographic plane {111} of the protection layer is lower than an amount of a crystallographic plane {111} of the dummy gate; and
    performing a wet etching process to remove the protection layer and the remaining dummy gate and thereby form a gate trench.

11. The method of claim 10, wherein the protection layer comprises Si—H bonds.

12. The method of claim 10, wherein a gas used in the dry etching process comprises $Cl_2$, HBr, $NH_3$ or a combination thereof.

13. The method of claim 10, wherein an ethant used in the wet etching process comprises tetramethyl ammonium hydroxide (TMAH).

14. The method of claim 10, wherein the dummy gate comprises pure amorphous silicon or a combination of amorphous silicon and crystalline silicon.

15. The method of claim 10, wherein a method of forming the dummy gate comprises:
    forming an amorphous silicon layer; and
    performing an annealing process to the amorphous silicon layer so as to partially transform the amorphous silicon layer into a polysilicon layer.

16. The method of claim 10, wherein the gate structure comprises an interfacial layer and the dummy gate.

17. The method of claim 16, wherein the interfacial layer comprises silicon oxide, silicon oxynitride, a high-k material with a dielectric constant greater than 4, or a combination thereof.

18. The method of claim 16, wherein the gate structure further comprises:
    a spacer, disposed on the substrate on a sidewall of the dummy gate; and
    two source/drain regions, disposed in the substrate beside the dummy gate, and
    wherein the two source/drain regions comprise doped regions, SiGe, SiC, SiP or a combination thereof.

* * * * *